(12) United States Patent
Dhanekula et al.

(10) Patent No.: US 8,055,594 B2
(45) Date of Patent: Nov. 8, 2011

(54) PROACTIVE DETECTION OF METAL WHISKERS IN COMPUTER SYSTEMS

(75) Inventors: Ramakrishna C. Dhanekula, San Diego, CA (US); Kenny C. Gross, San Diego, CA (US); David K. McElfresh, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 1029 days.

(21) Appl. No.: 11/985,288

(22) Filed: Nov. 13, 2007

(65) Prior Publication Data
US 2009/0125467 A1    May 14, 2009

(51) Int. Cl.
*G06F 15/18* (2006.01)
(52) U.S. Cl. .......................................... 706/12; 977/852
(58) Field of Classification Search .................... 706/12, 706/52, 916; 977/852; 323/222
See application file for complete search history.

(56) References Cited

U.S. PATENT DOCUMENTS

| | | | | |
|---|---|---|---|---|
| 5,514,971 A | * | 5/1996 | Hankui et al. | 324/639 |
| 5,715,052 A | * | 2/1998 | Fujino et al. | 356/237.2 |
| 2003/0224590 A1 | * | 12/2003 | Cho et al. | 438/585 |
| 2007/0077758 A1 | * | 4/2007 | Tsunekawa | 438/678 |
| 2008/0252309 A1 | * | 10/2008 | Gross et al. | 324/750 |
| 2009/0099830 A1 | * | 4/2009 | Gross et al. | 703/14 |

OTHER PUBLICATIONS

Brusse, J.A. et al. "Tin Whiskers: Attributes and Mitigation" CARTS 2002: 22nd Capacitor and Resistor Technology Symposium, Mar. 25-29, 2002. pages 67-80.*

* cited by examiner

*Primary Examiner* — Jeffrey A Gaffin
*Assistant Examiner* — Benjamin Buss
(74) *Attorney, Agent, or Firm* — Park, Vaughan, Fleming & Dowler LLP

(57) ABSTRACT

One embodiment of the present invention provides a system that proactively monitors and detects metal whisker growth in a target area within a computer system. During operation, the system collects target electromagnetic interference (EMI) signals using one or more antennas positioned in the vicinity of the target area. Next, the system analyzes the target EMI signals to proactively detect the onset of metal whisker growth in the target area.

29 Claims, 13 Drawing Sheets
(6 of 13 Drawing Sheet(s) Filed in Color)

PROACTIVE DETECTION OF METAL WHISKERS IN COMPUTER SYSTEMS

BACKGROUND

1. Field of the Invention

The present invention generally relates to techniques for proactive fault-monitoring in computer systems. More specifically, the present invention relates to a method and an apparatus that proactively detects metal whisker growth in a computer system by monitoring and analyzing real-time electromagnetic interference (EMI) signals from the computer system.

2. Related Art

The European Union's directives on Waste Electrical and Electronic Equipment (WEEE) and the Restriction of Hazardous Substances (RoHS), as well as the California State Senate bill on electronic waste recycling, have been enacted to protect the environment from "electronic waste." One of the materials required to be eliminated from electronic products under these new laws is lead. Lead (Pb) is the main substance in the Sn—Pb alloy which has been widely used as a plating material for printed circuit boards and wires to improve and preserve solderability over long periods of storage. As a result, electronic components are now being plated with pure tin (Sn) or high tin alloys as an alternative to the Sn—Pb plating.

However, a disadvantage of using pure tin or high tin alloy as a plating material is the spontaneous growth of needle-like conductive tin crystals from tin finished surfaces. These needle-like structures are commonly referred to as "tin whiskers." Note that tin whisker formation and growth can potentially cause current leakage or electrical shorting between adjacent leads of a component, between leads of adjacent components on a circuit board, or between leads of a component and the traces on the circuit board.

Although pure tin or high tin alloy-based products are relatively new in the electronics industry, a number of catastrophic failure events due to tin whisker related electrical shorting have already been reported in military, avionics, telecommunication, medical and consumer electronics applications. For example, Boeing reported the failure of a space control processor due to tin whiskers, which resulted in the complete loss of a $200 million communication satellite. More recently, there was a well-publicized failure of electronic systems on NASA's Space Shuttle due to long tin whisker formation.

One technique for detecting tin whisker buildup is to have trained personnel visually inspecting electronic parts that are mostly likely to grow tin whiskers. However, visual inspection is extremely labor-intensive and requires complex systems to be disassembled and reassembled. Hence, it is impractical to perform routine visual inspections for tin whiskers inside a large number of electronic systems. Another technique that the electronics industry is adopting to mitigate tin whisker growth is to apply conformal coatings on the electronics. However, the needle-like tin whiskers can still poke through a conformal coating. Unfortunately, there is no known technique in the electronics industry capable of proactively monitoring and detecting the buildup of conductive whiskers before shorting failures occur.

Hence, what is needed is a method and an apparatus that facilitates proactively detecting the incipience or the onset of conductive whiskers without the above-described problems.

SUMMARY

One embodiment of the present invention provides a system that proactively monitors and detects metal whisker growth in a target area within a computer system. During operation, the system collects target electromagnetic interference (EMI) signals using one or more antennas positioned in the vicinity of the target area. Next, the system analyzes the target EMI signals to proactively detect the onset of metal whisker growth in the target area.

In a variation on this embodiment, prior to collecting the target EMI signals, the system builds a pattern recognition model. Specifically, the system collects reference EMI signals using one or more antennas positioned in the vicinity of a reference area which is free of metal whiskers. The system then generates a reference EMI fingerprint from the reference EMI signals. Next, the system builds the pattern recognition model based on the reference EMI fingerprint.

In a further variation on this embodiment, the pattern recognition model is a non-linear, non-parametric (NLNP) regression model.

In a further variation on this embodiment, to analyze the target EMI signals, the system generates a target EMI fingerprint associated with the target area from the target EMI signals. The system then feeds the target EMI fingerprint as input to the pattern recognition model and subsequently produces an estimated EMI fingerprint as output from the pattern recognition model. Next, the system compares the target EMI fingerprint against the estimated EMI fingerprint. The system then detects the onset of metal whisker growth in the target area based on the comparison results.

In a further variation, the system generates the reference EMI fingerprint from the reference EMI signals by first transforming the reference EMI signals from a time-domain representation to a frequency-domain representation. The system then divides the frequency-domain representation into a plurality of frequencies. Next, the system constructs an EMI amplitude-time series for each of the plurality of frequencies based on the reference EMI signals collected over a predetermined time period. The system next selects a subset of frequencies from the plurality of frequencies based on the associated EMI amplitude-time series. The system then forms the reference EMI fingerprint using the set of EMI amplitude-time series associated with the selected frequencies.

In a further variation, the system selects the subset of frequencies by: computing cross-correlations between pairs of EMI amplitude-time series associated with pairs of the plurality of frequencies; computing an average correlation coefficient for each of the plurality of frequencies; and selecting the subset of frequencies which are associated with the highest average correlation coefficients.

In a further variation, the reference EMI signals are collected from the reference area while the computer system is executing a load script, wherein the load script includes a specified sequence of operations.

In a further variation, the load script is a dynamic load script.

In a further variation, the system builds the pattern recognition model by training the pattern recognition model using the set of EMI amplitude-time series in the reference EMI fingerprint as inputs to the pattern recognition model.

In a further variation, the system generates the target EMI fingerprint by first transforming the target EMI signals from a time-domain representation to a frequency-domain representation. Next, for each of the selected frequencies in the reference EMI fingerprint, the system generates an EMI amplitude-time series based on the frequency-domain representation of the target EMI signals collected over time. The system then forms the target EMI fingerprint using the set of EMI amplitude-time series associated with the selected frequencies.

In a further variation, the system compares the target EMI fingerprint against the estimated EMI fingerprint for each of the selected frequencies. Specifically, the system computes a residual signal between a corresponding monitored EMI amplitude-time series in the target EMI fingerprint and a corresponding estimated EMI amplitude-time series in the estimated EMI fingerprint. The system then detects anomalies in the residual signal by using sequential detection techniques, wherein the anomalies indicate a deviation of the monitored EMI amplitude-time series from the estimated EMI amplitude-time series.

In a further variation, the system detects the onset of metal whisker growth by activating an alarm indicating the onset of metal whisker growth in the target area when the anomalies are detected in one or more of the monitored EMI amplitude-time series.

In a further variation, the sequential detection techniques include a Sequential Probability Ratio Test (SPRT).

In a further variation, the target area can be a location or a region in the computer system which is susceptible to metal whisker growth; which is susceptible to failures/problems caused by metal whiskers; where metal whiskers have high likelihood to cause damages; or a combination of the above.

In a further variation, the reference area is the target area when the target area is determined to be free of metal whiskers.

In a variation on this embodiment, the metal whiskers can include tin whiskers, zinc whiskers, and any other types of conductive whiskers.

In a variation on this embodiment, the antenna can include a conductive wire and a coaxial cable.

BRIEF DESCRIPTION OF THE FIGURES

COLOR DRAWINGS

The patent or application file contains at least one drawing executed in color. Copies of this patent or patent application publication with color drawing(s) will be provided by the Office upon request and payment of the necessary fee.

Figure 1:
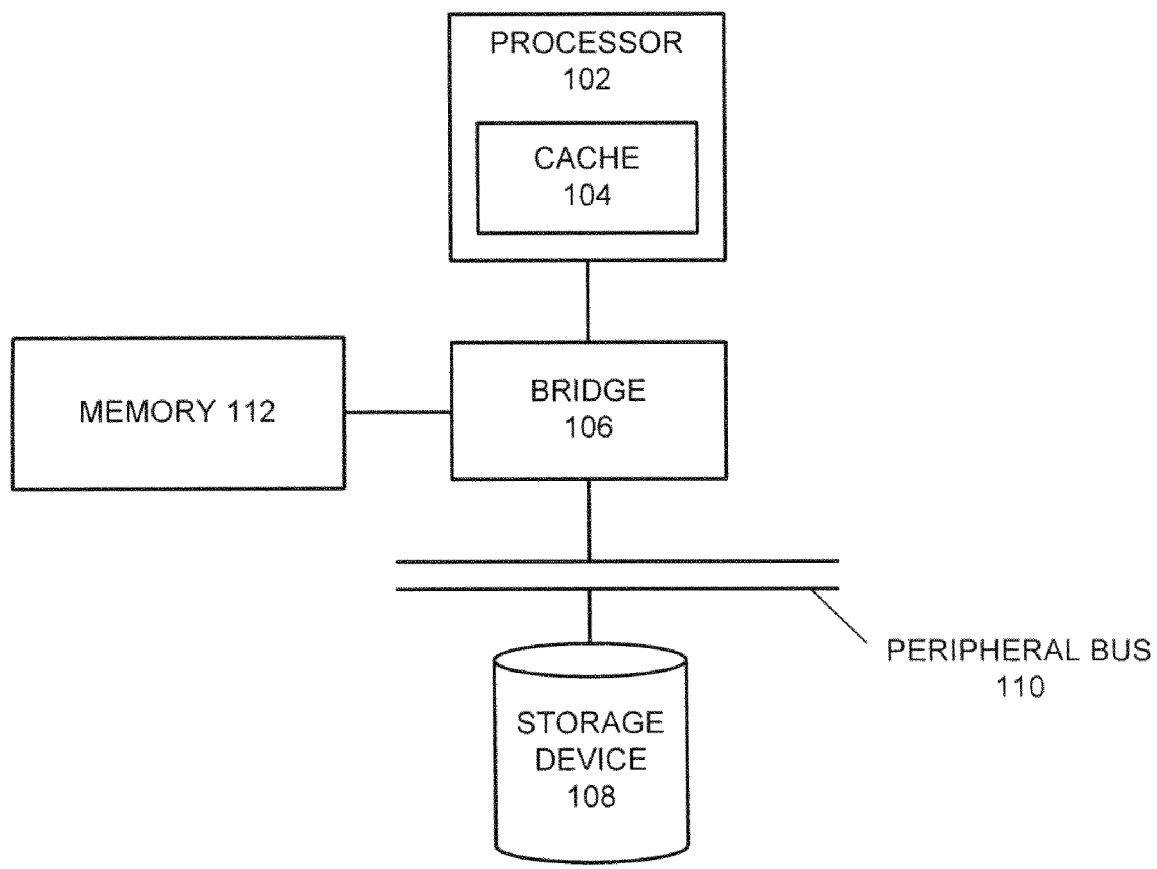

FIG. 1 illustrates a computer system in accordance with an embodiment of the present invention.

Figure 2:
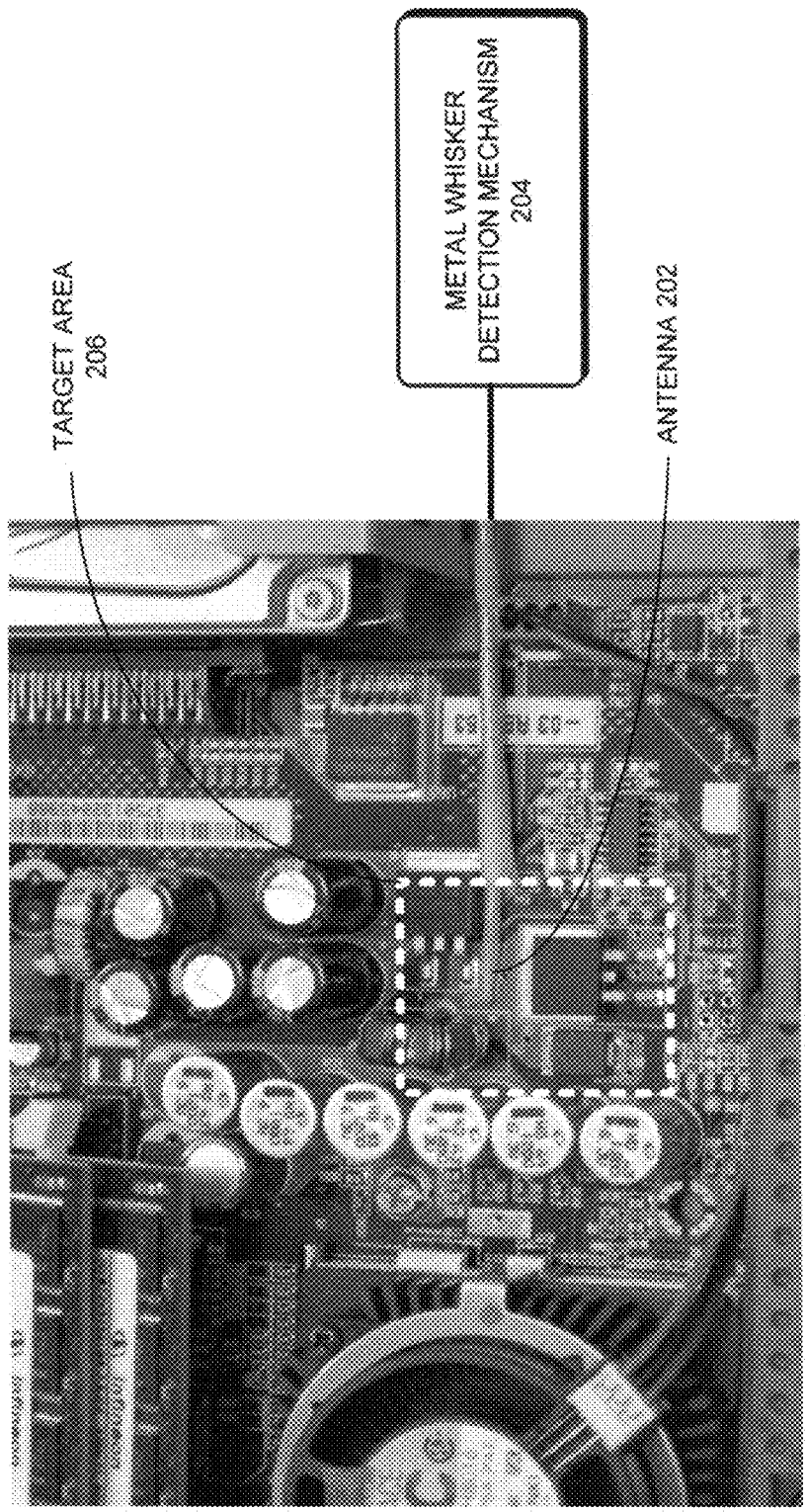

FIG. 2 illustrates the computer system associated with a metal whisker detector in accordance with an embodiment of the present invention.

Figure 3:
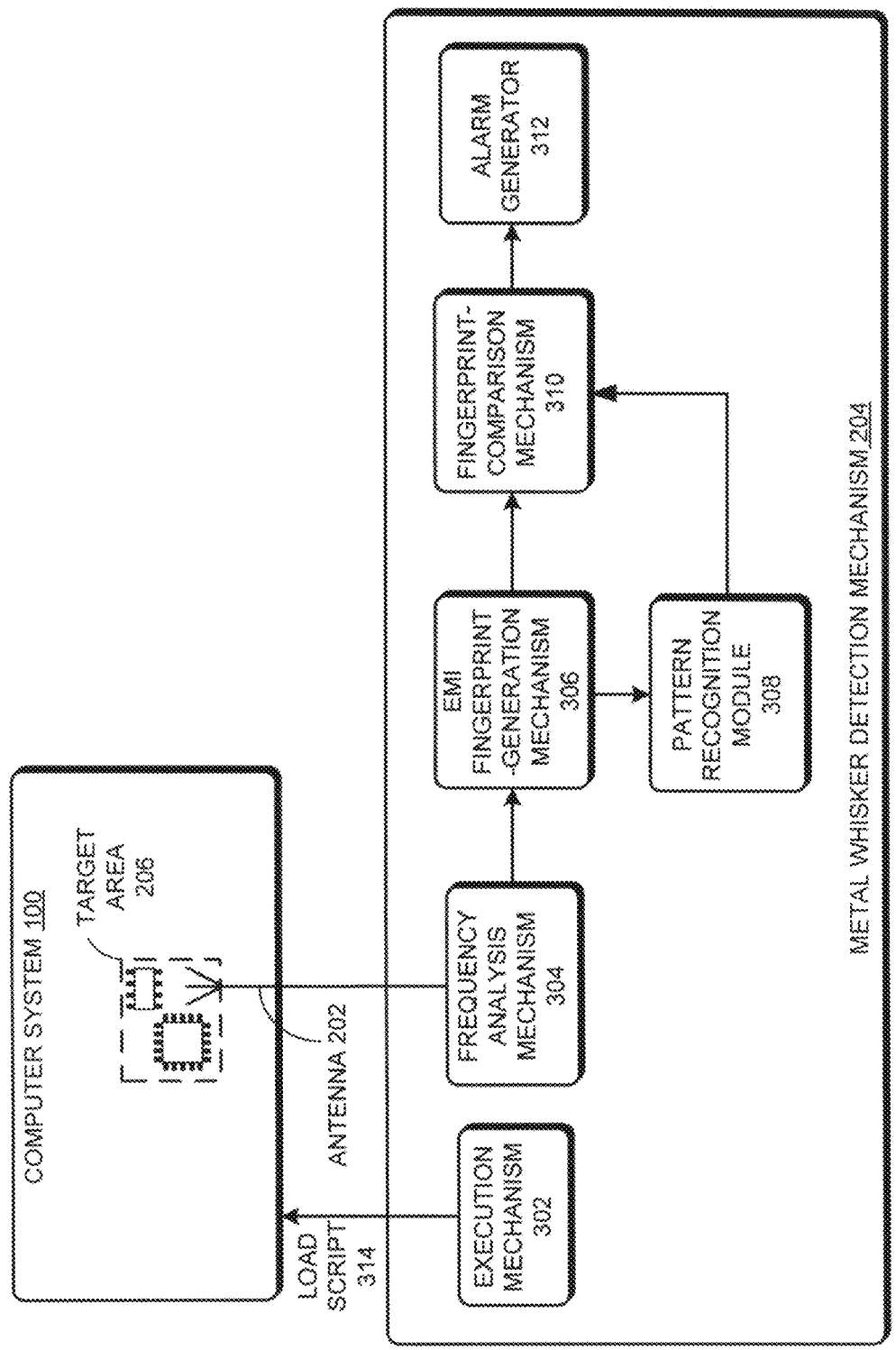

FIG. 3 illustrates the detailed structure of the metal whisker detection mechanism in accordance with an embodiment of the present invention.

Figure 4:
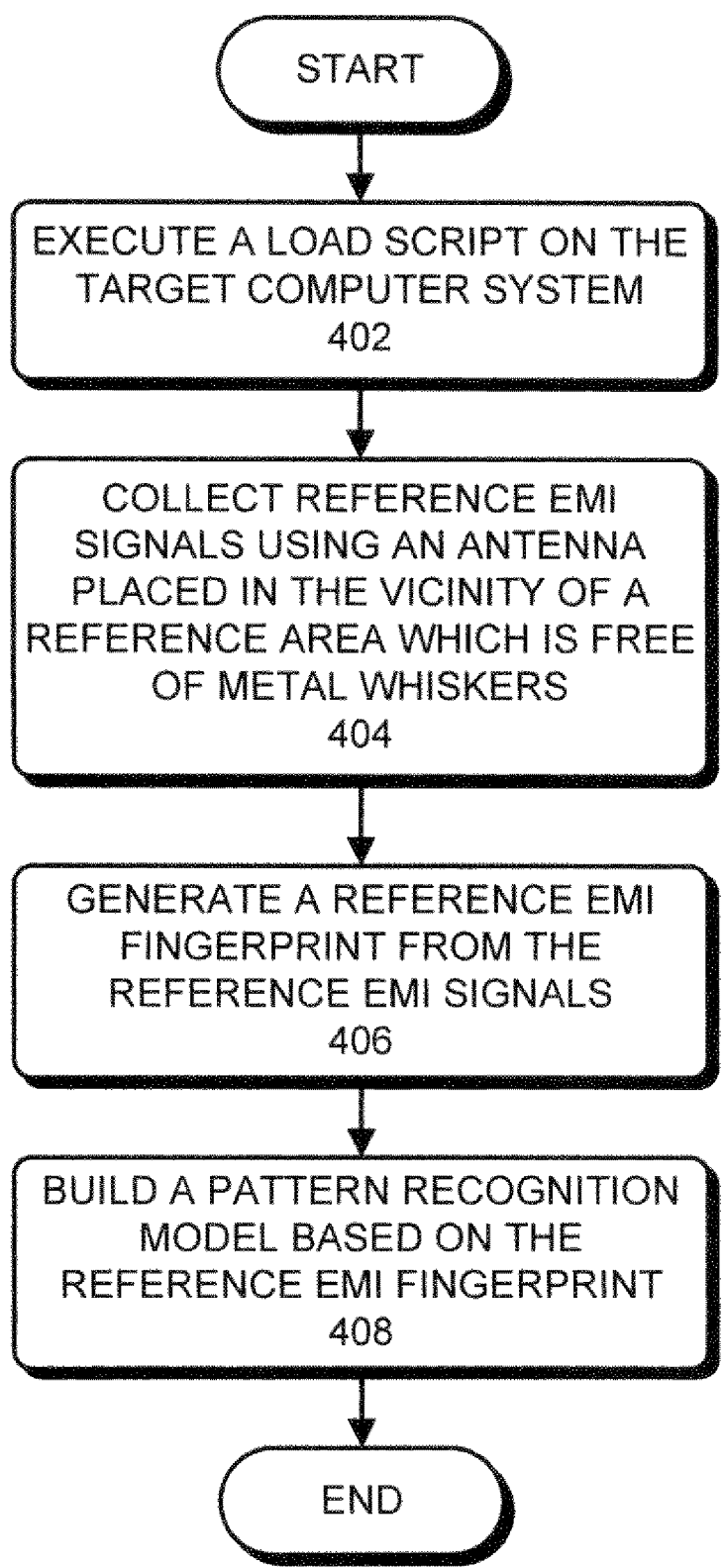

FIG. 4 presents a flowchart illustrating the process of building the pattern recognition model in accordance with an embodiment of the present invention.

Figure 5:
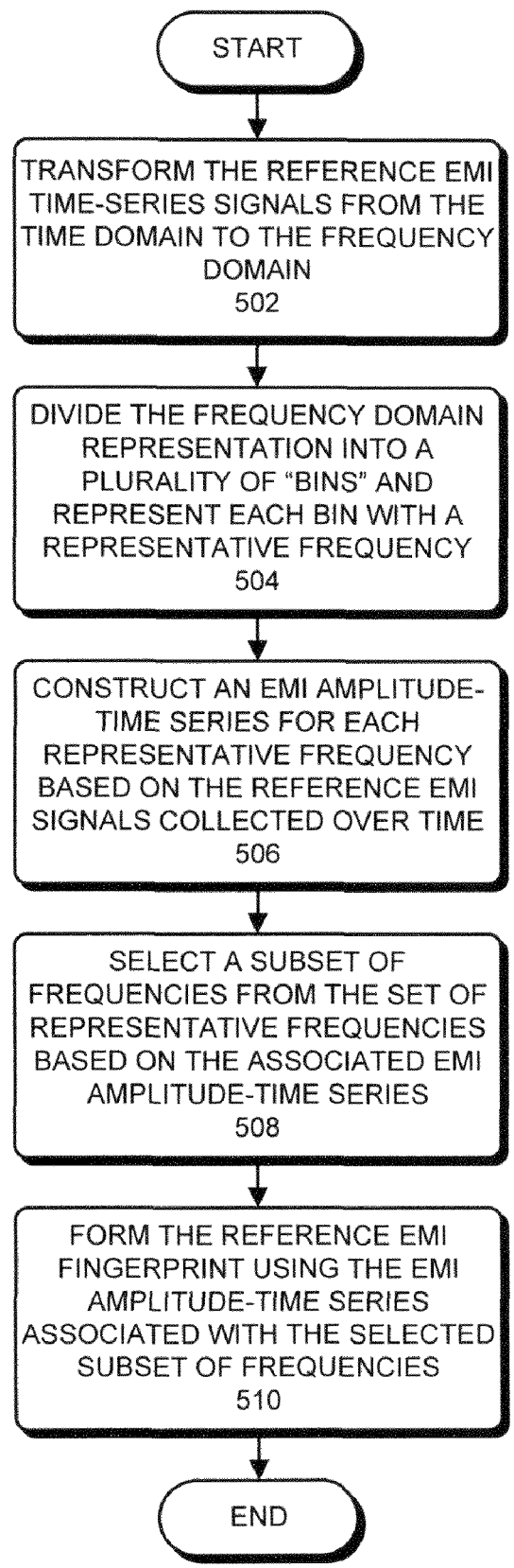

FIG. 5 presents a flowchart illustrating the process of generating the reference EMI fingerprint from the reference EMI signals in accordance with an embodiment of the present invention.

Figure 6:
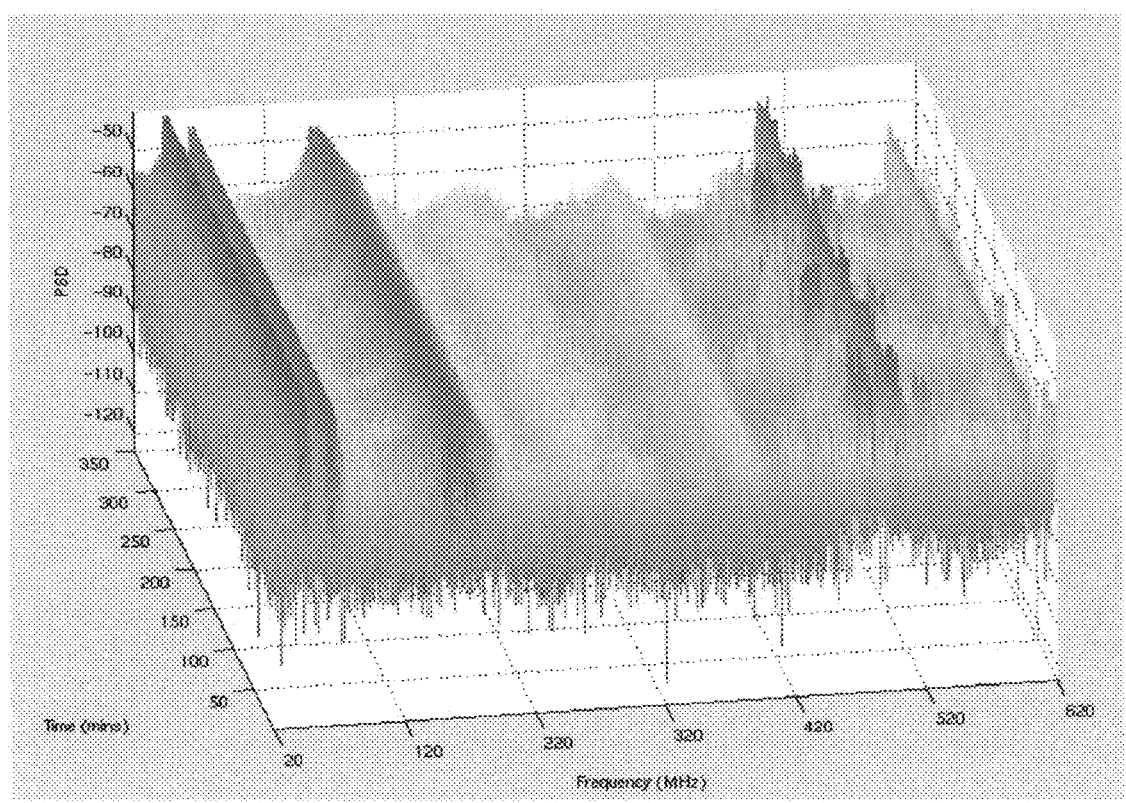

FIG. 6 illustrates a typical EMI frequency-spectrum while executing a dynamic load on the computer system in accordance with an embodiment of the present invention.

Figure 7:
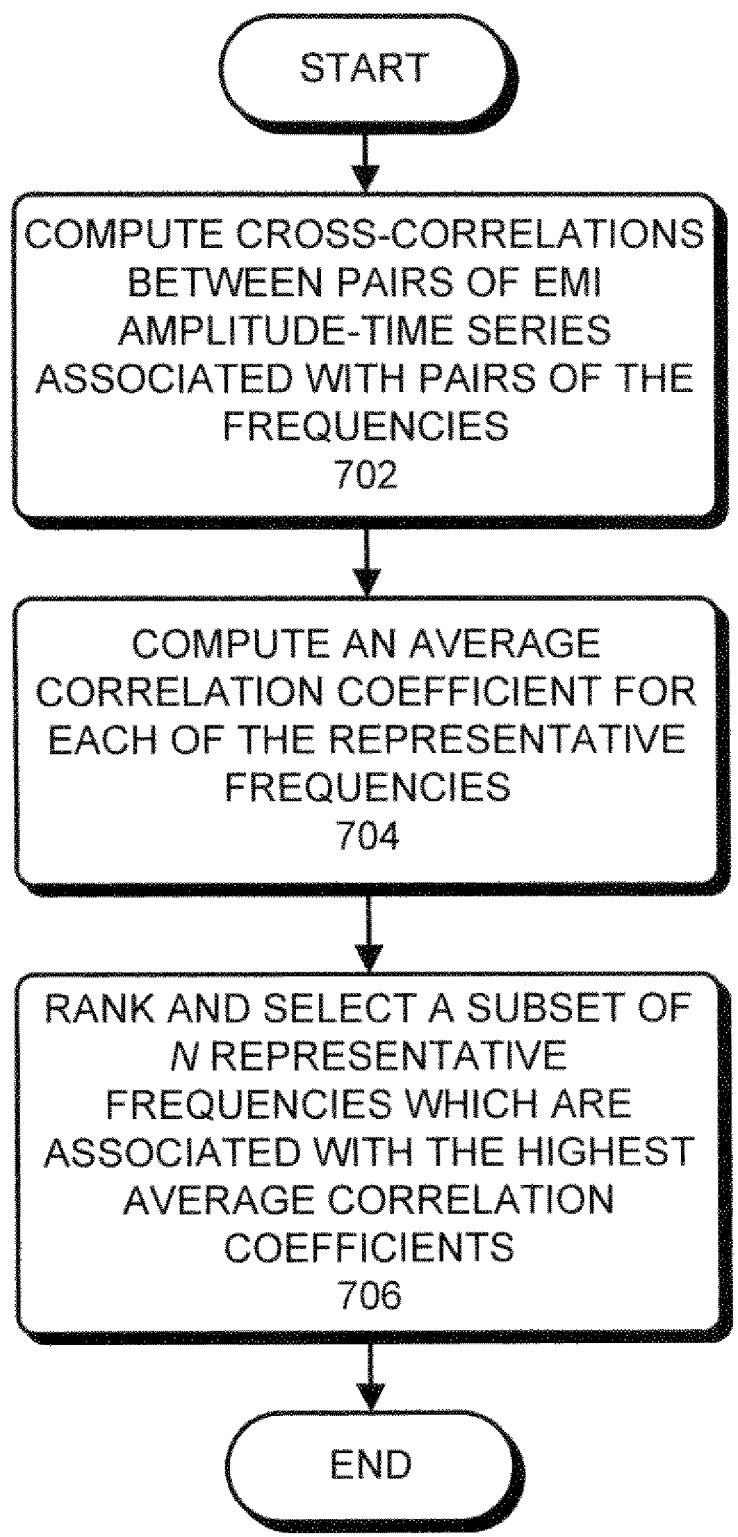

FIG. 7 presents a flowchart illustrating the process of selecting the subset of frequencies based on the correlations between the set of EMI amplitude-time series in accordance with an embodiment of the present invention.

Figure 8:
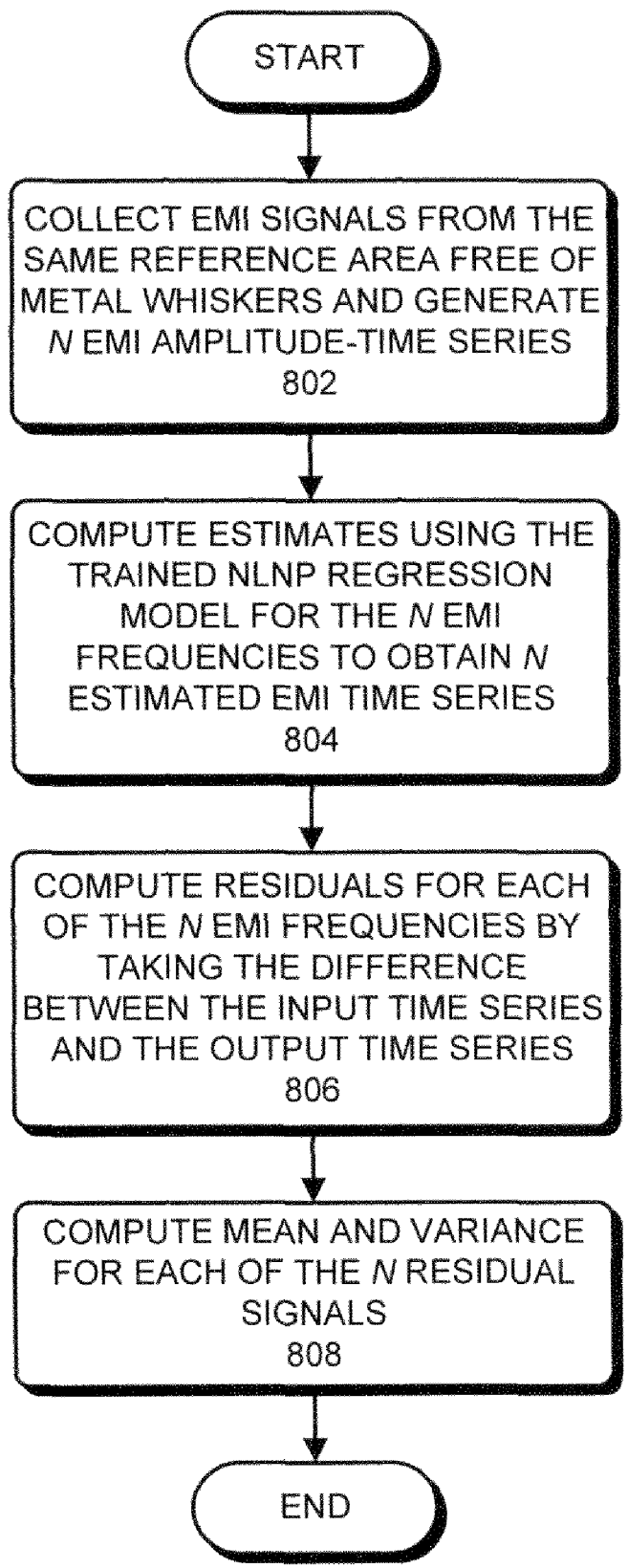

FIG. 8 presents a flowchart illustrating the process of computing mean and variance of residuals for the model estimates in accordance with an embodiment of the present invention.

Figure 9:
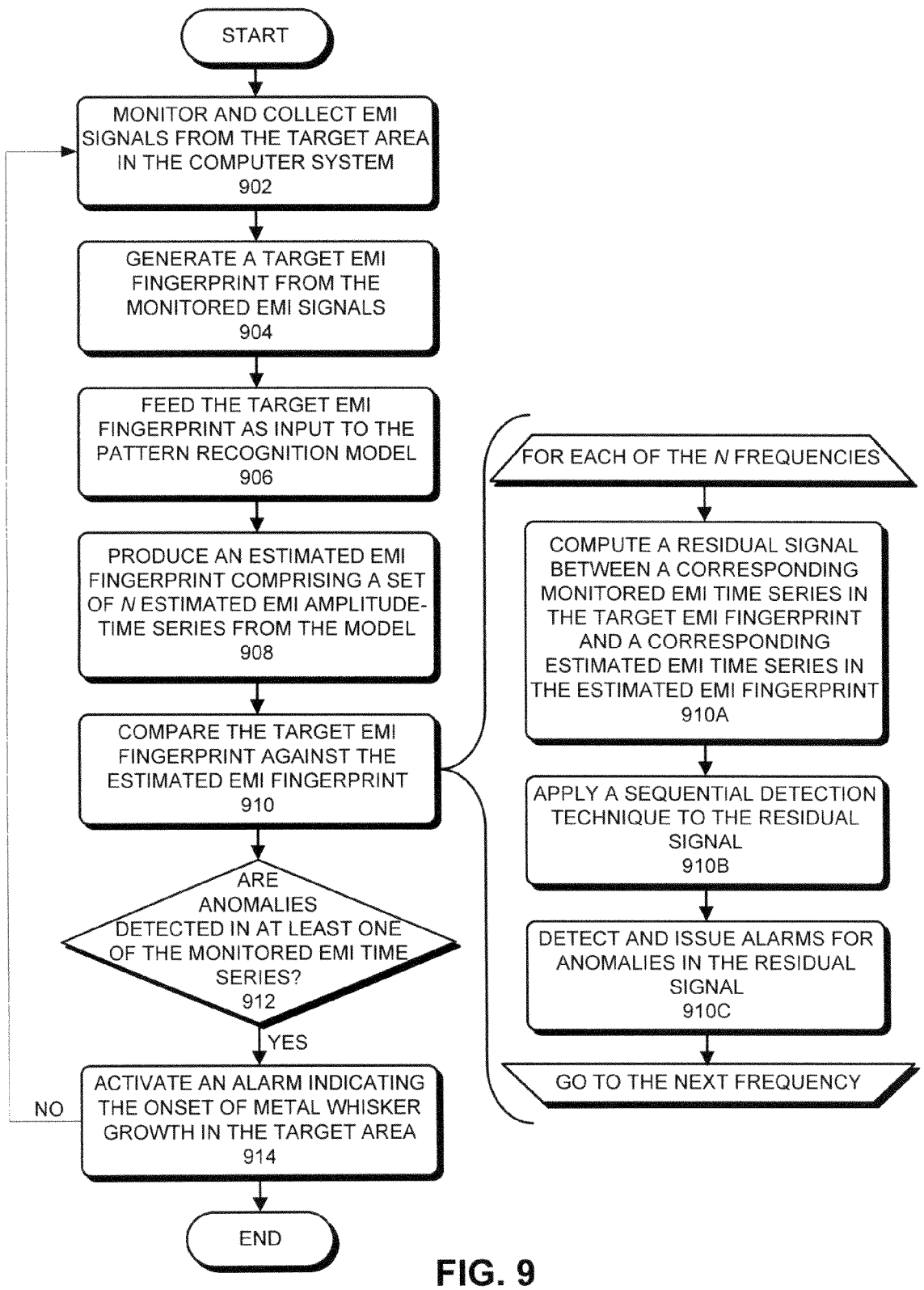

FIG. 9 presents a flowchart illustrating the process of monitoring real-time EMI signals to detect metal whisker growth in a target area in accordance with an embodiment of the present invention.

Figure 10A:
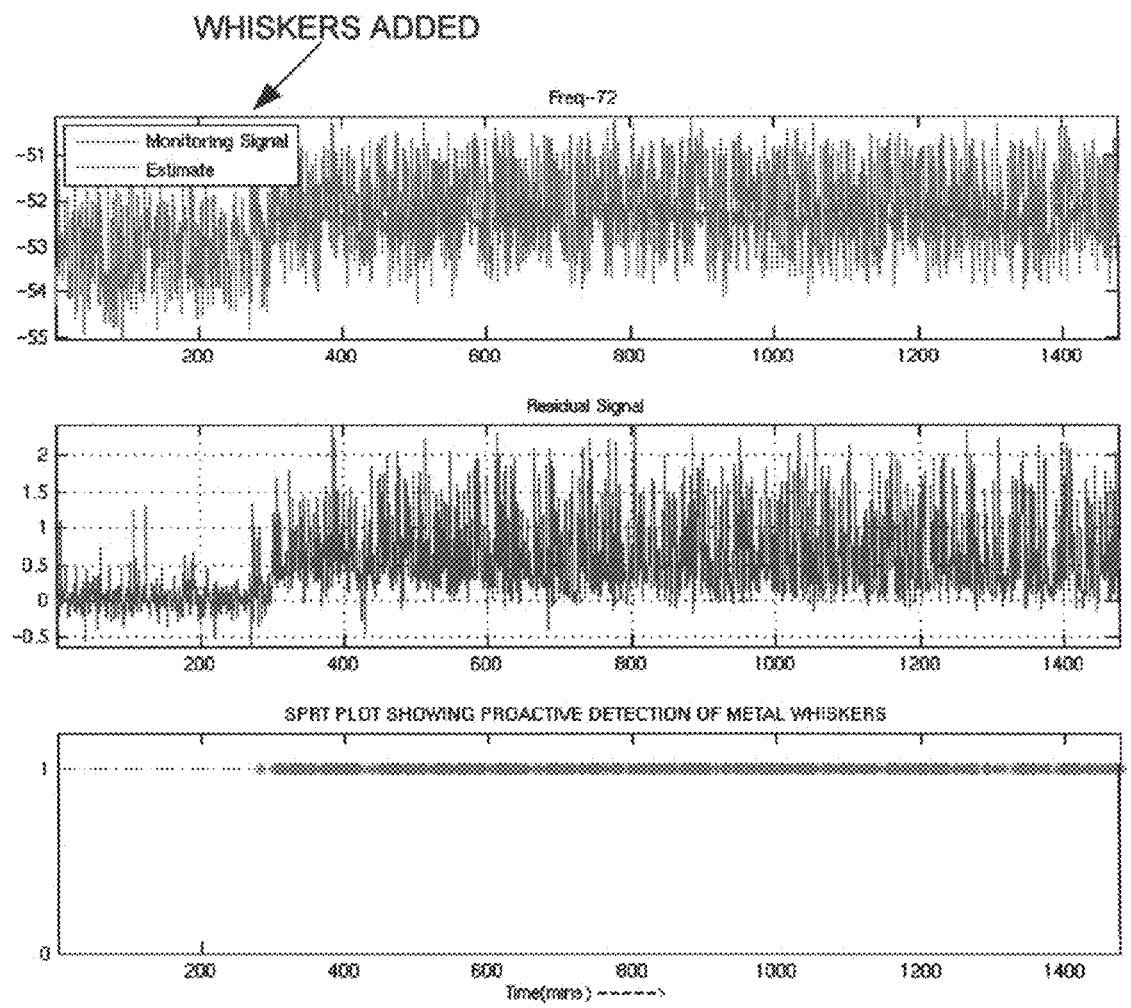
Figure 10B:
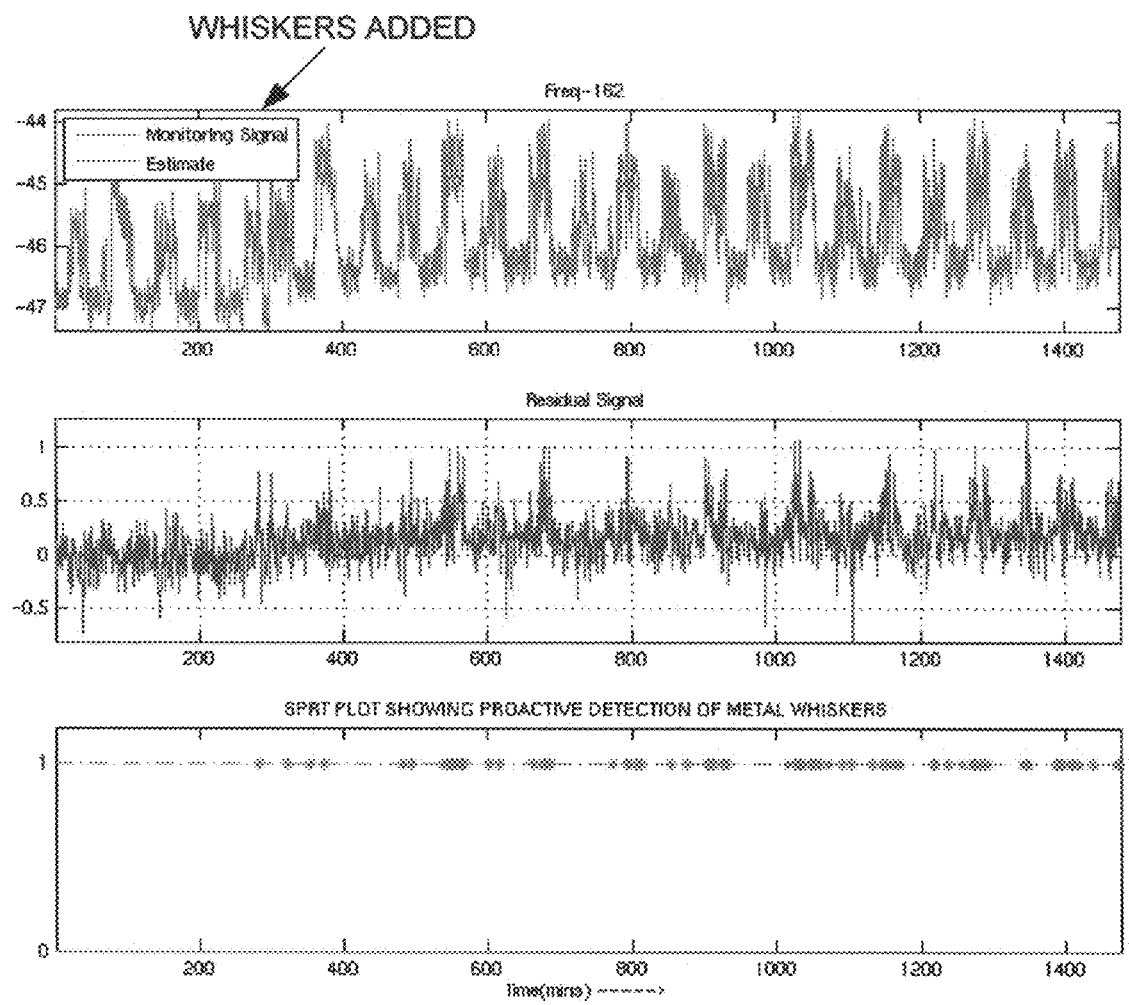

FIGS. 10A and 10B illustrate two examples of detecting metal whiskers by monitoring individual EMI amplitude-time series using an NLNP regression model in accordance with an embodiment of the present invention.

Figure 11A:
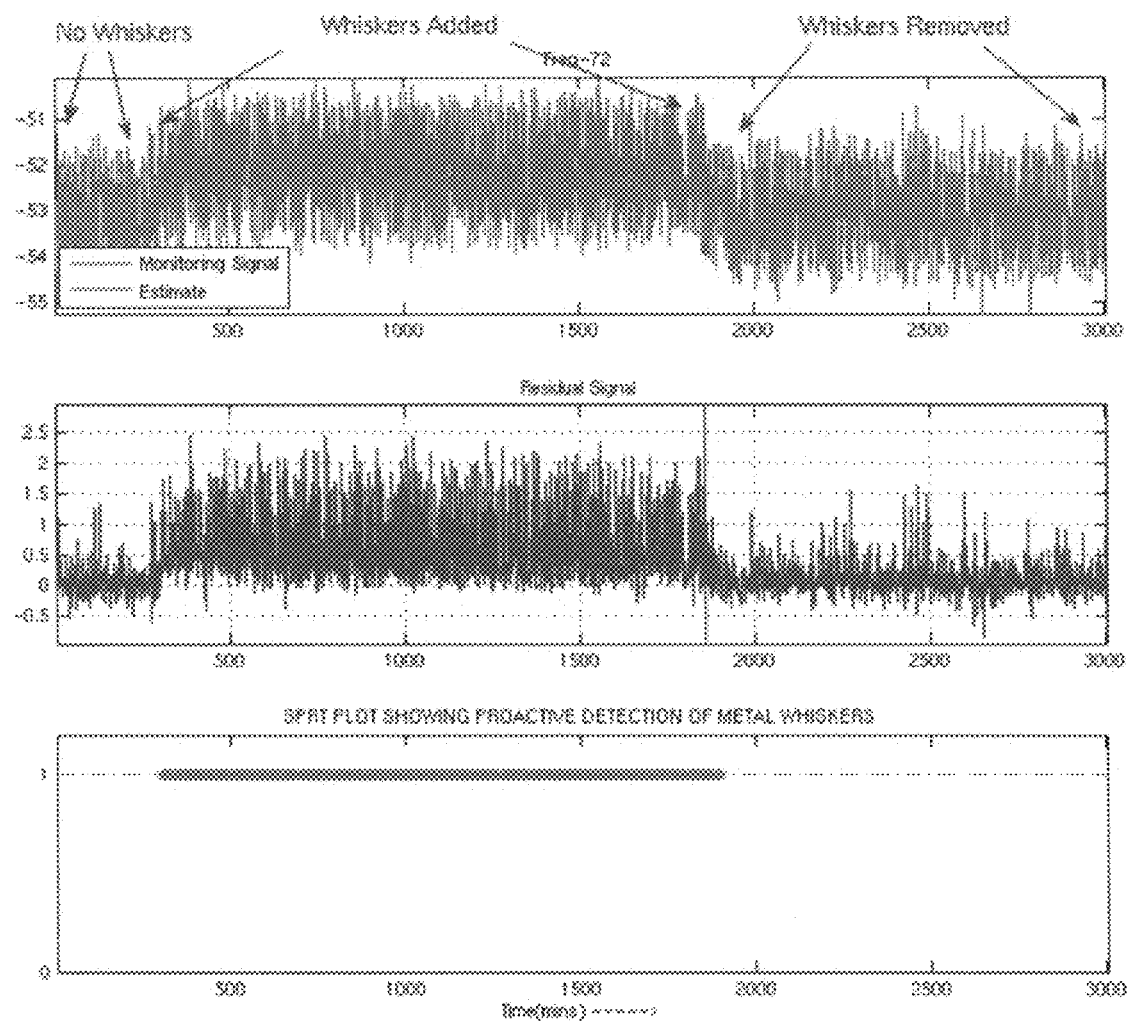
Figure 11B:
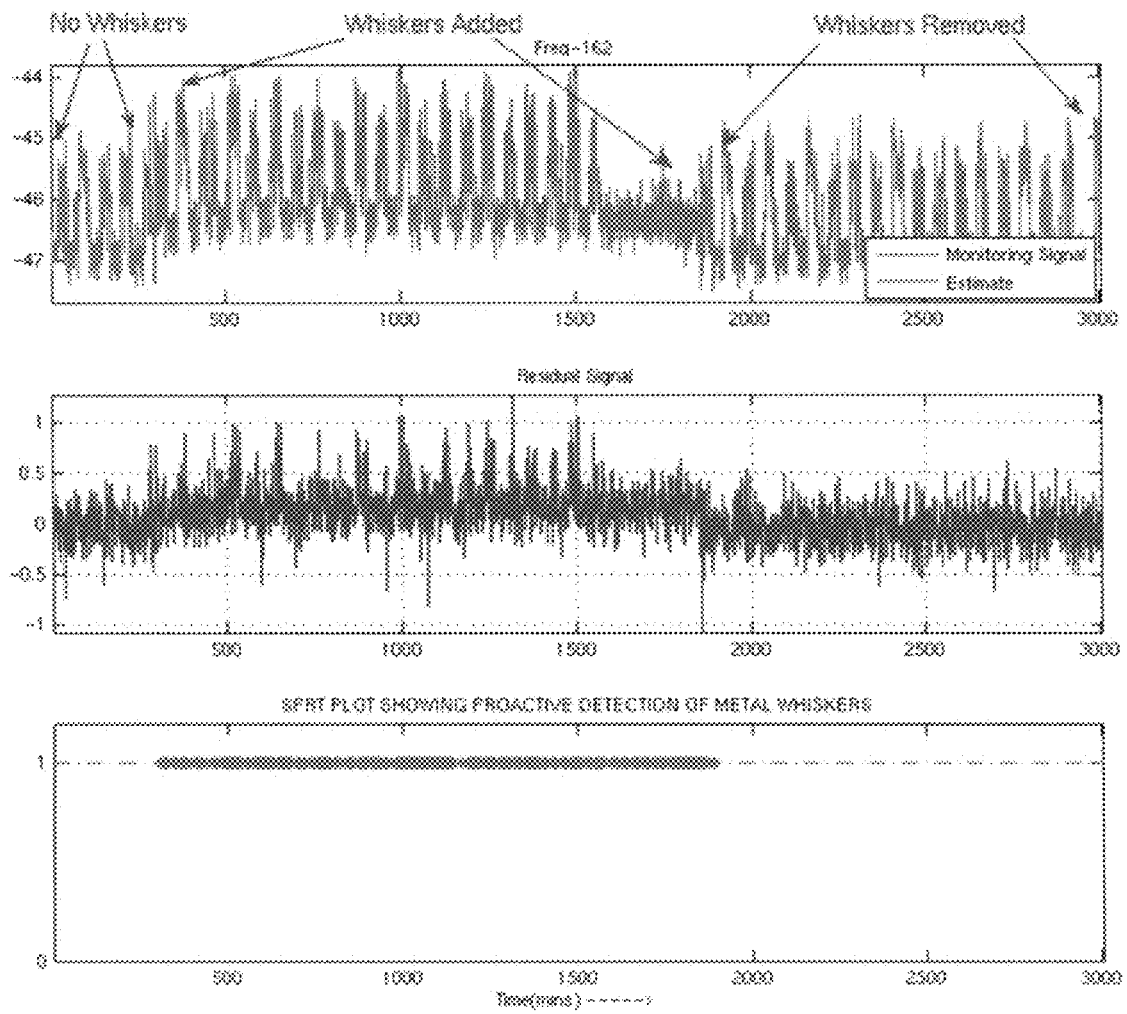

FIGS. 11A and 11B illustrate continuation of the EMI surveillance on the two selected frequencies after removal of the metal whiskers in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Overview

Electromagnetic interference (EMI) signals are generated by computer systems or other electronic systems during operation. These EMI signals are commonly regarded as noise, and electronic systems are often shielded to minimize the amount of EMI signals emitted by the electronic system. However, these EMI signals also carry information that can be used to generate unique fingerprints for system components. For example, it has been demonstrated that EMI signals generated by CPUs can be converted into digitized time series signals, and then used with a pattern-recognition mechanism for proactive health monitoring of server computer systems.

Embodiments of the present invention collect the EMI time series signals emitted from an area or a location inside a computer system which contains electronic components known to be prone to metal whisker buildup. The embodiments then detect the onset of metal whisker growth in the target area or location by analyzing the collected EMI time series signals. More specifically, the monitored EMI signals are compared with estimates from a pattern recognition model. The pattern recognition model is trained using "clean" EMI signals collected from the same area prior to the proactive monitoring, when the area is determined to be free of any metal whiskers. When using the monitored EMI signals as input to the pattern recognition model, the pattern recognition model computes estimates that predict the normal behavior of the EMI signals without the "contamination" from metal whiskers. Consequently, embodiments of the present invention proactively detect the onset of the metal whisker buildup in the target area when the monitored EMI signals deviate from the model estimates. In one embodiment of the present invention, the pattern recognition model is a non-linear, non-parametric (NLNP) regression model, such as MSET.

In one embodiment of the present invention, the EMI signals are collected using an antenna placed in the vicinity of the area of interest. In one embodiment of the present invention, comparing the monitored EMI signals with the model estimated EMI signals to detect anomalies in the monitor EMI signals involves using a Sequential Probability Ratio Test (SPRT).

Computer System

FIG. 1 illustrates a computer system 100 in accordance with an embodiment of the present invention. As illustrated in FIG. 1, computer system 100 includes processor 102, which is coupled to a memory 112 and to peripheral bus 110 through bridge 106. Bridge 106 can generally include any type of circuitry for coupling components of computer system 100 together.

Processor 102 can include any type of processor, including, but not limited to, a microprocessor, a digital signal processor, a personal organizer, a device controller and a computational engine within an appliance, and any other processor now known or later developed. Furthermore, processor 102 can include one or more cores. Processor 102 includes a cache 104 that stores code and data for execution by processor 102.

Although FIG. 1 illustrates computer system 100 with one processor, computer system 100 can include more than one processor. In a multi-processor configuration, the processors can be located on a single system board, or on multiple system boards.

Processor 102 communicates with storage device 108 through bridge 106 and peripheral bus 110. Storage device 108 can include any type of non-volatile storage device that can be coupled to a computer system. This includes, but is not limited to, magnetic, optical, and magneto-optical storage devices, as well as storage devices based on flash memory and/or battery-backed up memory.

Processor 102 communicates with memory 112 through bridge 106. Memory 112 can include any type of memory that can store code and data for execution by processor 102. This includes, but is not limited to, dynamic random access memory (DRAM), static random access memory (SRAM), flash memory, read-only memory (ROM), and any other type of memory now known or later developed.

Note that although the present invention is described in the context of computer system 100 as illustrated in FIG. 1, the present invention can generally operate on any type of computing device. Hence, the present invention is not limited to the specific implementation of computer system 100 as illustrated in FIG. 1.

Note that during operation of computer system 100, needle-like metal whiskers can emerge and grow at one or more locations within computer system 100. For example, tin whiskers can grow from such places as solder joints, lead wires, and metal traces on tin-plated printed circuit boards.

EMI Signal Sensing within a Computer System

FIG. 2 illustrates computer system 100 associated with a metal whisker detector in accordance with an embodiment of the present invention. In this embodiment, the metal whisker detector is an EMI sensor, i.e., antenna 202 coupled to metal whisker detection mechanism 204.

Note that antenna 202 in FIG. 2 can be a simple coaxial cable with ¼ inch of the outer insulation stripped off. In this configuration, the stripped end of the insulated cable is open to free space, and the other end of the cable is coupled to metal whisker detection mechanism 204. However, the antenna used for EMI sensing in the present invention is not limited to the particular configuration of antenna 202 in FIG. 2. In one embodiment of the present invention, antenna 202 can be an insulated wire with ¼ inch of insulation stripped off. In another embodiment of the present invention, the stripped length can be selected to achieve optimal discrimination sensitivity and robustness. Note that while many types of antennas can be used to collect the EMI signals, a stripped wire provides a simple and inexpensive option.

In one embodiment of the present invention, antenna 202 can include: a dipole antenna, a Yagi-Uda antenna, a loop antenna, an electrical short antenna (e.g., an open-ended wire having a length less than a quarter wavelength), a fractal antenna, a parabolic antenna, a microstrip antenna, a quad antenna, a random wire antenna (e.g., an open-ended wire having a length greater than one wavelength), a beverage antenna, a helical antenna, a phased array antenna, and any other type of antenna now known or later developed.

Note that antenna 202 is positioned inside computer system 100 within a target area 206. Note that metal whiskers can potentially grow from any area containing an exposed conductive surface. In one embodiment of the present invention, target area 206 is a location or a region associated with one or multiple electronic components known to be prone to the growth of metal whiskers. In another embodiment of the present invention, target area 206 is a location or a region associated with one or multiple electronic components particularly susceptible to failures/problems caused by metal whiskers. Note that each electronic component associated with target area 206 can potentially grow metal whiskers from one or more associated solder joints, lead wires, conductive pins and traces. In a further embodiment of the present invention, target area 206 is a location or a region where metal whiskers have high likelihood to cause damages. Note that such a region typically contains exposed metal surfaces that have low tolerances to metal whisker-induced shorting, for example, a region where even a short metal whisker can cause a shorting to occur.

Note that the placement of antenna 202 in relation to target area 206 is not limited to the particular configuration illustrated in FIG. 2. Generally, antenna 202 can be placed anywhere in the vicinity of target area 206. In this way, antenna 202 can pick up EMI emissions from one or more electronic components within target area 206 with a high signal-to-noise ratio (SNR). In one embodiment of the present invention, antenna 202 can be affixed to a mechanical structure in the vicinity of target area 206. In another embodiment of the present invention, antenna 202 can be affixed to a circuit board which contains target area 206.

Note that computer system 100 can contain multiple locations which are prone to metal whisker related failure/problem. In one embodiment of the present invention, multiple antennas can be placed in multiple target locations to collect EMI emissions from each of the target locations. In this embodiment, the system can simultaneously collect multiple high-SNR EMI signals from multiple target locations within computer system 100.

In one embodiment of the present invention, metal whisker detection mechanism 204 analyzes the EMI signals collected by antenna 202 in real-time or in near real-time to proactively detect the onset of metal whisker formation. We describe the operation of metal whisker detection mechanism 204 in more detail below.

Metal Whisker Detection Mechanism

FIG. 3 illustrates the detailed structure of metal whisker detection mechanism 204 in accordance with an embodiment of the present invention. As illustrated in FIG. 3, metal whisker detection mechanism 204 includes: an execution mechanism 302, a frequency analysis mechanism 304, an EMI fingerprint-generation mechanism 306, a pattern recognition module 308, a fingerprint-comparison mechanism 310, and an alarm generator 312.

In one embodiment of the present invention, execution mechanism 302 causes a load script 314 to be executed by computer system 100 during a metal-whisker-detection process. Note that the metal-whisker-detection process can be performed in parallel with normal computer system operation. In one embodiment of the present invention, execution mechanism 302 is only used during the training phase of the metal-whisker-detection process. Hence, execution mechanism 302 is idle during the monitoring phase of the metal-whisker-detection process. In one embodiment of the present invention, load script 314 is stored on computer system 100.

In one embodiment of the present invention, load script 314 can include: a sequence of instructions that produces a load profile that oscillates between specified CPU utilization percentages; and/or a sequence of instructions that produces a customized load profile. Note that a customized load profile can be used to produce a unique fingerprint which is difficult to spoof. In one embodiment of the present invention, the load script is a dynamic load script which changes the load on the CPU as a function of time.

In one embodiment of the present invention, during the metal-whisker-detection process, the EMI signals generated within target area 206 are collected by antenna 202 which is coupled to frequency analysis mechanism 304. Hence, the target EMI signals are received by frequency analysis mechanism 304, which then transforms the collected EMI time-series signals to the frequency-domain. In one embodiment of the present invention, the received target EMI signals are amplified prior to being transformed into frequency domain. In one embodiment of the present invention, frequency analysis mechanism 304 can include a spectrum analyzer.

Frequency analysis mechanism 304 is coupled to EMI fingerprint-generation mechanism 306. In one embodiment of the present invention, EMI fingerprint-generation mechanism 306 is configured to generate an EMI fingerprint based on the frequency-domain representation of the EMI signals. This process is described in more detail below in conjunction with FIG. 5.

As illustrated in FIG. 3, the output of EMI fingerprint-generation mechanism 306 is coupled to the inputs of both pattern recognition module 308 and fingerprint comparison mechanism 310. In one embodiment of the present invention, pattern recognition module 308 performs at least two functions. First, pattern recognition module 308 can build a pattern recognition model for estimating the EMI fingerprint associated with the EMI signals in the target area. Second, pattern recognition module 308 can use the above pattern recognition model to compute estimates of the EMI fingerprint associated with the EMI signals in the target area. This operation of pattern recognition module 308 is described in more detail below in conjunction with FIGS. 8 and 9.

Fingerprint-comparison mechanism 310 compares the real-time EMI fingerprint generated by EMI fingerprint-generation mechanism 306 to an estimated EMI fingerprint computed by the pattern recognition model. The comparison operation performed by fingerprint-comparison mechanism 310 is described in more detail below in conjunction with FIG. 9. Finally, alarm generator 312 in metal whisker detection mechanism 204 is configured to report the onset of metal whisker buildup in the target area based on the comparison results from fingerprint-comparison mechanism 310.

Building a Pattern Recognition Model

In one embodiment of the present invention, prior to performing the real-time detection of the onset of metal whisker buildup in the target area within computer system 100, the system builds a pattern recognition model based on clean EMI signals collected from an area known to be free of any metal whiskers. FIG. 4 presents a flowchart illustrating the process of building the pattern recognition model in accordance with an embodiment of the present invention.

During operation, the system executes a load script on computer system 100, wherein the load script includes a specified sequence of operations (step 402). In one embodiment of the present invention, the load script is a dynamic load script which changes the load on the CPU as a function of time. While executing the load script, the system collects reference EMI time-series signals using an antenna placed in the vicinity of a reference area within computer system 100 which is determined to be free of metal whiskers (step 404). In one embodiment of the present invention, the reference area is the target area when the target area is determined to be free of metal whiskers. For example, the reference EMI signals can be collected when computer system 100 is first deployed in the field. In another embodiment, the reference EMI signals can be collected from the reference area after the reference area has been visually inspected and determined to be free of metal whiskers.

Next, the system generates a reference EMI fingerprint from the reference EMI signals (step 406). We describe the process of generating the reference EMI fingerprint below in conjunction with FIG. 5. The system next builds the pattern recognition model based on the reference EMI fingerprint (step 408). Note that step 408 can be performed by pattern recognition module 308 in FIG. 3. We describe step 408 further below after we provide more details of generating the reference EMI fingerprint.

Generating the Reference EMI Fingerprint

FIG. 5 presents a flowchart illustrating the process of generating the reference EMI fingerprint from the reference EMI signals in accordance with an embodiment of the present invention.

During operation, the system starts by transforming the EMI time series signals from the time domain to the frequency domain (step 502). In one embodiment of the present invention, transforming the EMI time series signals from the time domain to the frequency domain involves using a fast Fourier transform (FFT). In other embodiments, other transform functions can be used, including, but not limited to, a Laplace transform, a discrete Fourier transform, a Z-transform, and any other transform technique now known or later developed.

The system then divides the frequency range associated with the frequency-domain representation of the reference EMI signals into a plurality of "bins," and represents each discrete bin with a representative frequency (step 504). For example, one can divide the frequency range into about 600 bins. In one embodiment, these frequency bins and the associated frequencies are equally spaced.

Next, for each of the plurality of representative frequencies, the system constructs an amplitude-time series based on the reference EMI time series signals collected over a predetermined time period (step 506). In one embodiment, to generate the time-series for each frequency, the EMI signals are sampled at predetermined time intervals, for example once every second or every minute. Next, each of the sampled EMI signal intervals is transformed into the frequency domain, and an amplitude-time pair is subsequently extracted for each of the representative frequencies at each time interval. In this way, the system generates a large number of separate amplitude-time series for the plurality of frequencies. We refer to these amplitude-time series as EMI amplitude-time series.

FIG. 6 illustrates a typical EMI frequency-spectrum while executing a dynamic load on the computer system in accordance with an embodiment of the present invention. Note that the frequency range is divided into a large number of discrete bins. For each of the discrete bins, the time observations of the reference EMI signals trace out a separate time series signature.

Referring back to FIG. 5, the system next selects a subset of frequencies from the plurality of frequencies based on the associated EMI amplitude-time series (step 508). Specifically, FIG. 7 presents a flowchart illustrating the process of selecting the subset of frequencies based on the correlations between the set of EMI amplitude-time series in accordance with an embodiment of the present invention.

During operation, the system computes cross-correlations between pairs of EMI amplitude-time series associated with pairs of the representative frequencies (step 702). Next, the system computes an average correlation coefficient for each of the plurality of representative frequencies (step 704). The system then ranks and selects a subset of N representative frequencies which are associated with the highest average correlation coefficients (step 706). Note that the EMI amplitude-time series associated with these N frequencies are the most highly correlated with other amplitude-time series. In one embodiment of the present invention, N is typically less than or equal to 20.

Referring back to FIG. 5, when the subset of frequencies has been selected, the system forms the reference EMI fingerprint using the EMI amplitude-time series associated with the selected frequencies (step 510).

Training the Pattern Recognition Model

Referring back to step 408 in FIG. 4, note that when the reference EMI fingerprint is generated, the system uses the set of N EMI amplitude-time series associated with the selected frequencies as training data to train the pattern recognition model. In one embodiment of the present invention, the pattern-recognition model is a non-linear, non-parametric (NLNP) regression model. In one embodiment of the present invention, the NLNP regression model is used during a multivariate state estimation technique (MSET). During this model training process, an NLNP regression model receives the set of EMI amplitude-time series (i.e., the reference EMI fingerprint) as inputs (i.e., training data), and learns the patterns of interaction between the set of N EMI amplitude-time series. Consequently, when the training is complete, the NLNP regression model is configured and ready to perform model estimates for the same set of N EMI amplitude-time series.

Computing Mean and Variance of Residuals for Monitoring

In one embodiment of the present invention, when the NLNP regression model is built, it is subsequently used to compute mean and variance of residuals associated with the model estimates. Note that these mean and variance values will be used during the real-time monitoring process as described below. Specifically, FIG. 8 presents a flowchart illustrating the process of computing mean and variance of residuals for the model estimates in accordance with an embodiment of the present invention.

During operation, the system collects EMI signals from the same reference area within computer system 100 which is free of metal whiskers and generates the same set of N EMI amplitude-time series in a process as described above (step 802). The system then computes estimates using the trained NLNP regression model for the set of N EMI frequencies (step 804). Specifically, the NLNP regression model receives the set of N EMI amplitude-time series as inputs and produces a corresponding set of N estimated EMI amplitude-time series as outputs. Next, the system computes the residuals for each of the N EMI frequencies by taking the difference between the corresponding input time series and the output time series (step 806). Hence, the system obtains N residual signals. The system then computes mean and variance for each of the N residual signals (step 808).

Monitoring Real-time EMI Signals to Detect Metal Whisker Growth

FIG. 9 presents a flowchart illustrating the process of monitoring real-time EMI signals to detect metal whisker growth in a target area in accordance with an embodiment of the present invention.

During a monitoring operation, the system monitors and collects real-time EMI signals from the target area in computer system 100 (step 902). In one embodiment of the present invention, computer system 100 is performing routine operations during the monitoring process, hence computer system 100 may be executing any workload during this process.

The system then generates a target EMI fingerprint from the monitored EMI signals (step 904). Note that the target EMI fingerprint can be generated from the real-time EMI signals in a similar manner to generating the reference EMI fingerprint as described in conjunction with FIG. 5. In one embodiment of the present invention, the system generates the target EMI fingerprint by: (1) transforming the monitored EMI time-series signals from the time-domain to the frequency-domain; (2) for each of the set of N frequencies in the reference EMI fingerprint, generating a monitored EMI amplitude-time series based on the frequency-domain representation of the monitored EMI signals collected over time; and (3) forming the target EMI fingerprint using the set of N monitored EMI amplitude-time series associated with the selected N frequencies. In one embodiment of the present invention, the target EMI fingerprint comprises all the N frequencies as the reference EMI fingerprint. In a further embodiment, the target EMI fingerprint comprises a subset of the N frequencies in the reference EMI fingerprint.

Next, the system feeds the target EMI fingerprint as input to the pattern recognition model which has been trained using the reference EMI fingerprint (step 906), and subsequently produces an estimated EMI fingerprint as output (step 908). In one embodiment of the present invention, the estimated EMI fingerprint comprises a set of N estimated EMI amplitude-time series corresponding to the set of N monitored EMI amplitude-time series in the target EMI fingerprint.

The system then compares the target EMI fingerprint against the estimated EMI fingerprint (step 910). Specifically, for each of the selected N frequencies, the system computes a residual signal between a corresponding monitored EMI amplitude-time series in the target EMI fingerprint and a corresponding estimated EMI amplitude-time series in the estimated EMI fingerprint (step 910A). The system then applies a sequential detection technique to the residual signal (step 910B). In one embodiment of the present invention, the sequential detection technique is a Sequential Probability Ratio Test (SPRT). In one embodiment of the present invention, the SPRT uses the mean and variance computed for the corresponding residual signal during the model training process to detect anomalies in the residual signal, wherein the anomalies indicate a deviation of the monitored EMI amplitude-time series from the estimated EMI amplitude-time series. Note that when such anomalies are detected in the residual signal, SPRT alarms are subsequently issued (step 910C).

Next, the system determines if anomalies are detected in at least one of the N monitored EMI amplitude-time series, for example, based on the SPRT alarms (step 912). If so, the system activates an alarm indicating the onset of metal whisker growth in the target area (step 914). Otherwise, the system returns to step 902 to continue monitoring the EMI signals from the target area.

EXAMPLES OF MONITORING INDIVIDUAL EMI TIME SERIES

FIGS. 10A and 10B illustrate two examples of detecting metal whiskers by monitoring individual EMI amplitude-time series using an NLNP regression model in accordance with an embodiment of the present invention. Specifically, FIG. 10A is associated with the selected frequency "Freq-72" and the associated EMI amplitude-time series being monitored, and FIG. 10B is associated with the selected frequencies "Freq-162" and the associated EMI amplitude-time series being monitored. Note that in the upper subplot of each of the FIGS. 10A and 10B, the red signal is the EMI time series signal being monitored, and the green signal is the NLNP regression model estimate (i.e., the signal that is estimated by the NLNP pattern recognition model based on the learned correlations from the training data collected when the system was free of conductive whisker contamination).

At around time=280 minutes, a number of "simulated" metal whiskers made of very fine copper filaments were added to the exposed metal surfaces in the target area where the EMI signals are being monitored. Note that after the placement of the metal whiskers, the red and green signals diverge from each other as a result of the addition of the metal whiskers. The middle subplot in each of the FIGS. 10A and 10B illustrates the residual signals obtained by subtracting the NLNP estimates (green) from the corresponding monitored EMI signal (red). The lower subplot in each of the FIGS. 10A and 10B shows alarms issued from SPRT, which signify a statistically significant divergence between the NLNP estimates and the monitored EMI time series signal. In both examples, the onset of the SPRT alarms correlates extremely well with the addition of the metal whiskers.

FIGS. 11A and 11B illustrate continuation of the EMI surveillance on the two selected frequencies after removal of the metal whiskers in accordance with an embodiment of the present invention. Specifically, FIG. 11A is associated with the selected frequency "Freq-72" and the associated EMI amplitude-time series being monitored, and FIG. 11B is associated with the selected frequencies "Freq-162" and the associated EMI amplitude-time series being monitored. Note that both of the monitored EMI time series signals return to their original states of prior to the addition of metal whiskers. This is a further indication that the "metal whisker detection" alarms are triggered as a result of the presence of the metal whiskers.

Note that embodiments of the present invention are equally applicable to tin whiskers, zinc whiskers, or any other type of conductive fiber-like contamination within electronic systems.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for proactively monitoring and detecting metal whisker growth in a target area within a computer system, the method comprising:
   collecting target electromagnetic interference (EMI) signals using one or more antennas positioned in the vicinity of the target area; and
   analyzing the target EMI signals to proactively detect the onset of metal whisker growth in the target area, wherein the detection of the onset of metal whisker growth is performed during normal operation of the computer system.

2. The method of claim 1, wherein prior to collecting the target EMI signals, the method further comprises:
   collecting reference EMI signals using one or more antennas positioned in the vicinity of a reference area which is free of metal whiskers;
   generating a reference EMI fingerprint from the reference EMI signals; and
   building a pattern recognition model based on the reference EMI fingerprint.

3. The method of claim 2, wherein the pattern recognition model is a non-linear, non-parametric (NLNP) regression model.

4. The method of claim 2, wherein analyzing the target EMI signals to proactively detect the onset of metal whisker growth in the target area involves:
   generating a target EMI fingerprint associated with the target area from the target EMI signals;
   feeding the target EMI fingerprint as input to the pattern recognition model;
   producing an estimated EMI fingerprint as output from the pattern recognition model;
   comparing the target EMI fingerprint against the estimated EMI fingerprint; and
   detecting the onset of metal whisker growth in the target area based on the comparison results.

5. The method of claim 4, wherein generating the reference EMI fingerprint from the reference EMI signals involves:
   transforming the reference EMI signals from a time-domain representation to a frequency-domain representation;
   dividing the frequency-domain representation into a plurality of frequencies;
   constructing an EMI amplitude-time series for each of the plurality of frequencies based on the reference EMI signals collected over a predetermined time period;
   selecting a subset of frequencies from the plurality of frequencies based on the associated EMI amplitude-time series; and
   forming the reference EMI fingerprint using the set of EMI amplitude-time series associated with the selected frequencies.

6. The method of claim 5, wherein selecting the subset of frequencies involves:
   computing cross-correlations between pairs of EMI amplitude-time series associated with pairs of the plurality of frequencies;
   computing an average correlation coefficient for each of the plurality of frequencies; and
   selecting the subset of frequencies which are associated with the highest average correlation coefficients.

7. The method of claim 5, wherein the reference EMI signals are collected from the reference area while the computer system is executing a load script, wherein the load script includes a specified sequence of operations.

8. The method of claim 7, wherein the load script is a dynamic load script.

9. The method of claim 5, wherein building the pattern recognition model based on the reference EMI fingerprint involves training the pattern recognition model using the set of EMI amplitude-time series associated with the selected frequencies as inputs to the pattern recognition model.

10. The method of claim 5, wherein generating the target EMI fingerprint involves:
   transforming the target EMI signals from a time-domain representation to a frequency-domain representation;
   for each of the selected frequencies in the reference EMI fingerprint, generating an EMI amplitude-time series based on the frequency-domain representation of the target EMI signals collected over time; and
   forming the target EMI fingerprint using the set of EMI amplitude-time series associated with the selected frequencies.

11. The method of claim 10, wherein comparing the target EMI fingerprint against the estimated EMI fingerprint involves:
   for each of the selected frequencies,
      computing a residual signal between a corresponding monitored EMI amplitude-time series in the target EMI fingerprint and a corresponding estimated EMI amplitude-time series in the estimated EMI fingerprint; and
      detecting anomalies in the residual signal by using sequential detection techniques, wherein the anomalies indicate a deviation of the monitored EMI amplitude-time series from the estimated EMI amplitude-time series.

12. The method of claim 11, wherein detecting the onset of metal whisker growth based on the comparison results involves activating an alarm indicating the onset of metal whisker growth in the target area when the anomalies are detected in one or more of the monitored EMI amplitude-time series.

13. The method of claim 11, wherein the sequential detection techniques include a Sequential Probability Ratio Test (SPRT).

14. The method of claim 1, wherein the target area can be a location or a region in the computer system:
   which is susceptible to metal whisker growth;
   which is susceptible to failures/problems caused by metal whiskers;
   where metal whiskers have high likelihood to cause damages; or a combination of the above.

15. The method of claim 2, wherein the reference area is the target area when the target area is determined to be free of metal whiskers.

16. The method of claim 1, wherein the metal whiskers can include
   tin whiskers;
   zinc whiskers; and
   any other types of conductive whiskers.

17. The method of claim 1, wherein the antenna can include:
   a conductive wire; and
   a coaxial cable.

18. A computer-readable storage medium storing instructions that when executed by a computer cause the computer to perform a method for proactively monitoring and detecting metal whisker growth in a target area within a computer system, the method comprising:
   collecting target electromagnetic interference (EMI) signals using one or more antennas positioned in the vicinity of the target area; and
   analyzing the target EMI signals to proactively detect the onset of metal whisker growth in the target area, wherein the detection of the onset of metal whisker growth is performed during normal operation of the computer system.

19. The computer-readable storage medium of claim 18, wherein prior to collecting the target EMI signals, the method further comprises:
   collecting reference EMI signals using one or more antennas positioned in the vicinity of a reference area which is free of metal whiskers;
   generating a reference EMI fingerprint from the reference EMI signals; and
   building a pattern recognition model based on the reference EMI fingerprint.

20. The computer-readable storage medium of claim 19, wherein the pattern recognition model is a non-linear, non-parametric (NLNP) regression model.

21. The computer-readable storage medium of claim 19, wherein analyzing the target EMI signals to proactively detect the onset of metal whisker growth in the target area involves:
   generating a target EMI fingerprint associated with the target area from the target EMI signals;
   feeding the target EMI fingerprint as input to the pattern recognition model;
   producing an estimated EMI fingerprint as output from the pattern recognition model;
   comparing the target EMI fingerprint against the estimated EMI fingerprint; and
   detecting the onset of metal whisker growth in the target area based on the comparison results.

22. The computer-readable storage medium of claim 21, wherein generating the reference EMI fingerprint from the reference EMI signals involves:
   transforming the reference EMI signals from a time-domain representation to a frequency-domain representation;
   dividing the frequency-domain representation into a plurality of frequencies;
   constructing an EMI amplitude-time series for each of the plurality of frequencies based on the reference EMI signals collected over a predetermined time period;
   selecting a subset of frequencies from the plurality of frequencies based on the associated EMI amplitude-time series; and
   forming the reference EMI fingerprint using the set of EMI amplitude-time series associated with the selected frequencies.

23. The computer-readable storage medium of claim 22, wherein the reference EMI signals are collected from the reference area while the computer system is executing a dynamic load script.

24. The computer-readable storage medium of claim 22, wherein building the pattern recognition model based on the reference EMI fingerprint involves training the pattern recognition model using the set of EMI amplitude-time series associated with the selected frequencies as inputs to the pattern recognition model.

25. The computer-readable storage medium of claim 22, wherein generating the target EMI fingerprint involves:
   transforming the target EMI signals from a time-domain representation to a frequency-domain representation;

for each of the selected frequencies in the reference EMI fingerprint, generating an EMI amplitude-time series based on the frequency-domain representation of the target EMI signals collected over time; and forming the target EMI fingerprint using the set of EMI amplitude-time series associated with the selected frequencies.

26. The computer-readable storage medium of claim 25, wherein comparing the target EMI fingerprint against the estimated EMI fingerprint involves:

for each of the selected frequencies,
computing a residual signal between a corresponding monitored EMI amplitude-time series in the target EMI fingerprint and a corresponding estimated EMI amplitude-time series in the estimated EMI fingerprint; and detecting anomalies in the residual signal by using sequential detection techniques, wherein the anomalies indicate a deviation of the monitored EMI amplitude-time series from the estimated EMI amplitude-time series.

27. The computer-readable storage medium of claim 26, wherein detecting the onset of metal whisker growth based on the comparison results involves activating an alarm indicating the onset of metal whisker growth in the target area when the anomalies are detected in one or more of the monitored EMI amplitude-time series.

28. An apparatus that proactively monitors and detects metal whisker growth in a target area within a computer system, comprising:

a collecting mechanism configured to collect target electromagnetic interference (EMI) signals using one or more antennas positioned in the vicinity of the target area; and an analysis mechanism configured to analyze the target EMI signals to proactively detect the onset of metal whisker growth in the target area, wherein the detection of the onset of metal whisker growth is performed during normal operation of the computer system.

29. The apparatus of claim 28, wherein the antenna can include:

a conductive wire; and
a coaxial cable.

* * * * *